(12) United States Patent
Jeong et al.

(10) Patent No.: US 9,781,826 B2
(45) Date of Patent: Oct. 3, 2017

(54) FOLDABLE DISPLAY

(71) Applicant: Samsung Display Co., Ltd., Yongin, Gyeonggi-do (KR)

(72) Inventors: Gyeong Ho Jeong, Suwon-si (KR); Chang Min Park, Gwangmyeong-si (KR); Sung Sang Ahn, Hwaseong-si (KR); Sang Wol Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/825,041

(22) Filed: Aug. 12, 2015

(65) Prior Publication Data

US 2016/0212890 A1 Jul. 21, 2016

(30) Foreign Application Priority Data

Jan. 15, 2015 (KR) ........................ 10-2015-0007615

(51) Int. Cl.
| | | |
|---|---|---|
| *H05K 1/02* | (2006.01) | |
| *G06F 1/20* | (2006.01) | |
| *G06F 1/16* | (2006.01) | |
| *G09F 9/30* | (2006.01) | |

(52) U.S. Cl.
CPC ............... *H05K 1/028* (2013.01); *G06F 1/16* (2013.01); *G06F 1/20* (2013.01); *G09F 9/301* (2013.01)

(58) Field of Classification Search
CPC .. H05K 7/20963; H05K 1/028; H05K 1/0278; H05K 1/0281; H05K 1/0283; H05K 3/4691; H05K 1/189; H05K 1/0393; H05K 2201/10128; H05K 2201/055; G06F 1/20; G06F 1/203; H01L 2251/5338; H01L 51/0097; G02F 1/133305; G02F 2202/28; G02F 2001/133628
USPC ........... 361/679.21, 679.26–679.3, 704, 705, 361/715–722
See application file for complete search history.

(56) References Cited

U.S. PATENT DOCUMENTS

| | | | | |
|---|---|---|---|---|
| 2008/0062625 | A1* | 3/2008 | Batio | G06F 1/1615 361/679.29 |
| 2010/0277443 | A1* | 11/2010 | Yamazaki | G06F 1/1616 345/204 |
| 2010/0277448 | A1* | 11/2010 | Okamoto | G02F 1/133305 345/206 |
| 2010/0315399 | A1 | 12/2010 | Jacobson et al. | |
| 2013/0258565 | A1* | 10/2013 | Nishi | H05K 7/14 361/679.01 |
| 2014/0003006 | A1* | 1/2014 | Ahn | G06F 1/1679 361/749 |

(Continued)

FOREIGN PATENT DOCUMENTS

| | | |
|---|---|---|
| KR | 10-2009-0019897 A | 2/2009 |
| KR | 10-2012-0136933 A | 12/2012 |
| KR | 10-1372429 B1 | 3/2014 |

*Primary Examiner* — Adam B Dravininkas
(74) *Attorney, Agent, or Firm* — Knobbe Martens Olson & Bear LLP (57) ABSTRACT

A foldable display is disclosed. In one aspect, the display includes a flexible display panel including a folding region at which the flexible display panel is configured to be folded and a rigid plane region. The display further includes a heat dissipation sheet attached to one side of the plane region and configured to dissipate heat generated by the flexible display panel. The heat dissipation sheet is not attached to the folding region.

11 Claims, 6 Drawing Sheets

(56) References Cited

U.S. PATENT DOCUMENTS

| | | | | |
|---|---|---|---|---|
| 2014/0370222 A1* | 12/2014 | Kim | ................. | F28F 21/081 428/40.9 |
| 2015/0062823 A1* | 3/2015 | Seo | ................. | B32B 38/10 361/704 |
| 2016/0142623 A1* | 5/2016 | Misawa | ................. | G03B 17/02 348/333.03 |

* cited by examiner

FOLDABLE DISPLAY

RELATED APPLICATION

This application claims priority to and the benefit of Korean Patent Application No. 10-2015-0007615 filed in the Korean Intellectual Property Office on Jan. 15, 2015, the entire contents of which are incorporated herein by reference.

BACKGROUND

Field

The described technology generally relates to a foldable display.

Description of the Related Technology

Foldable displays include a flexible display panel which can be folded or bent.

Since foldable displays are easy to carry when folded and can be unfolded to have a larger screen size, they can be used in various applications such as televisions, monitors, and the like as well as in mobile devices such as mobile phones, ultra-mobile personal computers (PCs), electronic books, and electronic newspapers.

SUMMARY OF CERTAIN INVENTIVE ASPECTS

One inventive aspect is a foldable display having a folding region with an improved flexibility and including a heat dissipation sheet so as to dissipate heat generated from the flexible display panel to the environment.

Another aspect is a foldable display, comprising a flexible display panel including: i) a folding region at which the flexible display panel is configured to be folded and ii) a plane region, wherein the plane region is rigid; and a heat dissipation sheet attached to one side of the plane region and configured to dissipate heat generated by the flexible display panel, wherein the heat dissipation sheet does not overlap with the folding region.

In exemplary embodiments, the foldable display further comprises a bonding layer interposed between the flexible display panel and the heat dissipation sheet. The bonding layer can include an adhesive or a double-sided tape. The heat dissipation sheet can comprise a copper sheet. The heat dissipation sheet can comprise a graphite sheet. The heat dissipation sheet can comprise a copper sheet and a graphite sheet formed over the copper sheet.

In exemplary embodiments, the heat dissipation sheet further comprises a bonding layer interposed between the copper sheet and the graphite sheet. The bonding layer can include an adhesive or a double-sided tape.

Another aspect is a foldable display, comprising a flexible display panel, wherein the flexible display panel comprises a folding region and a pair of plane regions formed on opposing sides of the folding region; and a pair of heat dissipation sheets respectively attached to the plane regions, wherein the heat dissipation sheets do not contact the folding area.

In exemplary embodiments, the foldable display further comprises further comprising a cover window attached to the flexible display panel, wherein the heat dissipation sheets and the cover window are attached to opposing sides of the flexible display panel. Each of the heat dissipation sheets can comprise a copper sheet and a graphite sheet formed over the copper sheet.

According to at least one embodiment, the foldable display has an improved flexibility in the folding region of the flexible display panel and can dissipate the heat generated from the flexible display panel to the environment via an included heat dissipation sheet formed in the plane region of the flexible display panel.

BRIEF DESCRIPTION OF THE DRAWINGS

The drawings are referenced in describing exemplary embodiments and the technical scope of the described technology is not to be interpreted or limited to the accompanying drawings.

DETAILED DESCRIPTION OF CERTAIN INVENTIVE EMBODIMENTS

When a foldable display is folded, the inner side of the folded area experiences a compressive force (compression), and the outer side of the folded experiences a tensile force (stretch).

Even when a material having excellent restorative force is used, when the flexible display panel undergoes repeated folding cycles, on the order of tens of thousands of times, the display panel becomes deformed due to repetitive stress. In addition, as the thickness of the folded portion increases, the restoration force increases for unfolding.

As such, the panel deformation and the increase in the restoration force lead to increased difficulty of the mechanical design.

In addition, when a heat dissipation sheet is attached to the front surface of the flexible display panel and folding/unfolding is repeated, the sheet may be partially or entirely damaged at the folding region.

Further, research into methods for rapidly dissipating heat from the display panel components is ongoing.

As such, demand is increasing for foldable displays having improved flexibility in the folding area and improved heat dissipation.

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

Accordingly, the drawings and description are to be regarded as illustrative in nature and not restrictive. Like reference numerals designate like elements throughout the specification.

In addition, since the sizes and thicknesses of the respective components shown in the drawings may be exaggerated for clarity, the described technology is not necessarily limited to the dimensions of components shown in the drawings.

In the drawings, the thicknesses of layers, films, panels, regions, etc., may be exaggerated for the sake of clarity. It will be understood that when an element such as a layer, film, region, or substrate is referred to as being "on" another element, it can be directly on the other element or intervening elements may also be present.

Hereinafter, a foldable display according to an exemplary embodiment will be described in detail with reference to the accompanying drawings.

Figure 1:
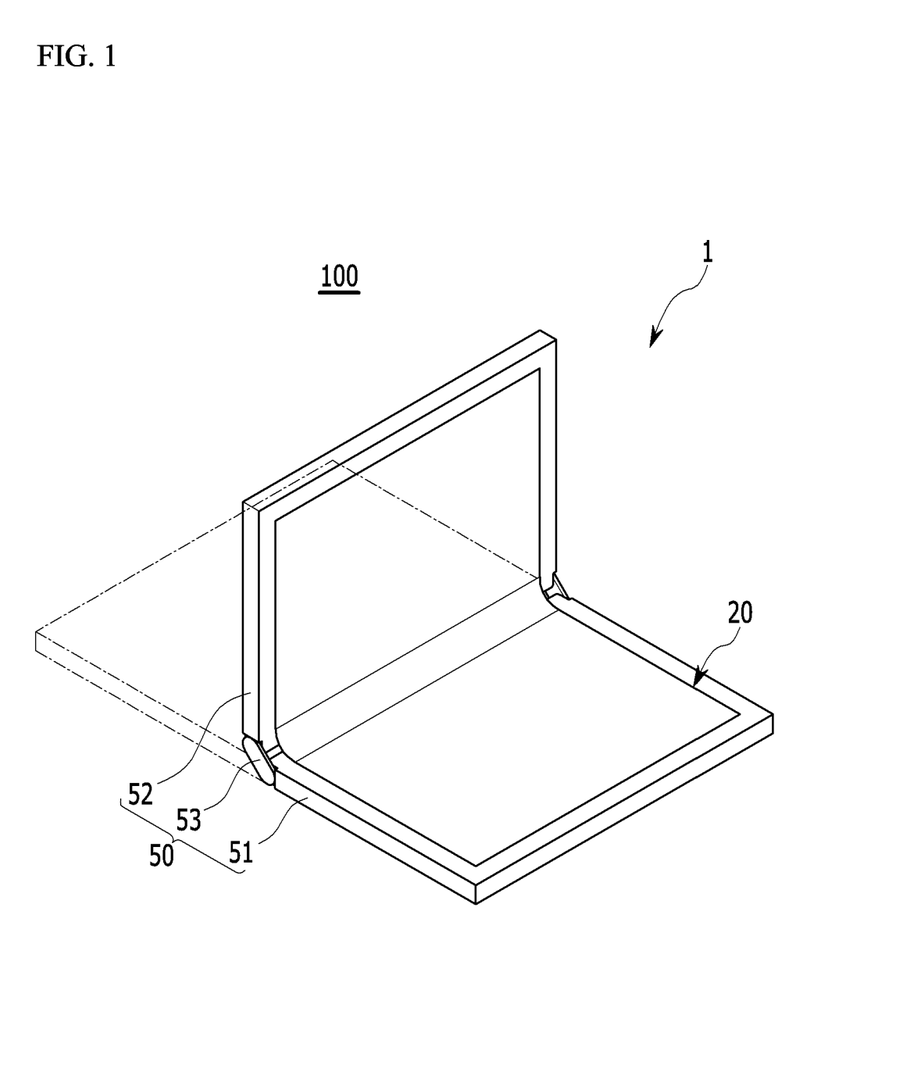
FIG. 1 is a perspective view schematically showing a foldable display according to an exemplary embodiment.
Figure 2:
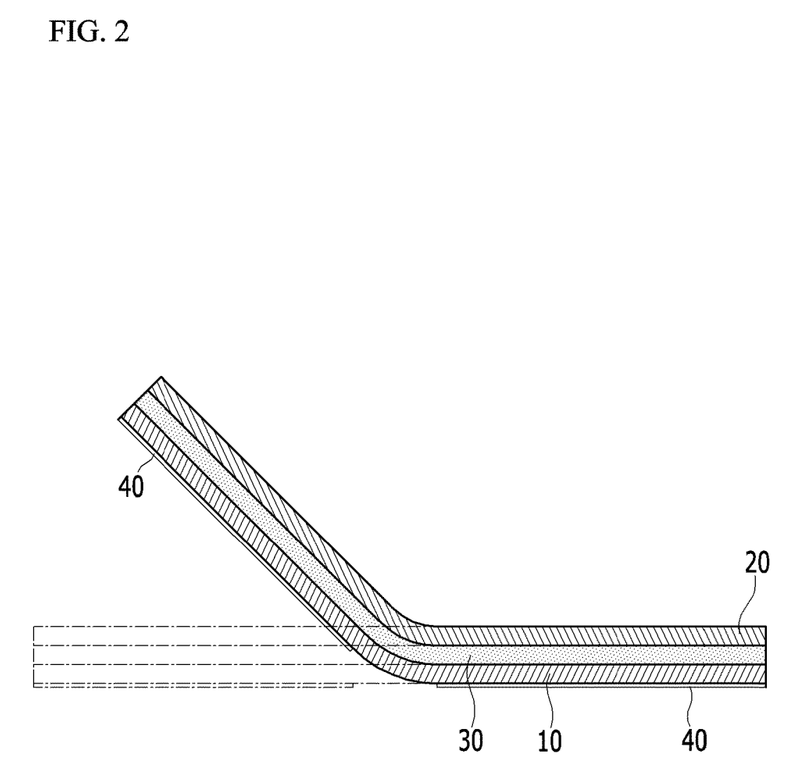
FIG. 2 is a partial cross-sectional view of the foldable display according to an exemplary embodiment.
Figure 3:
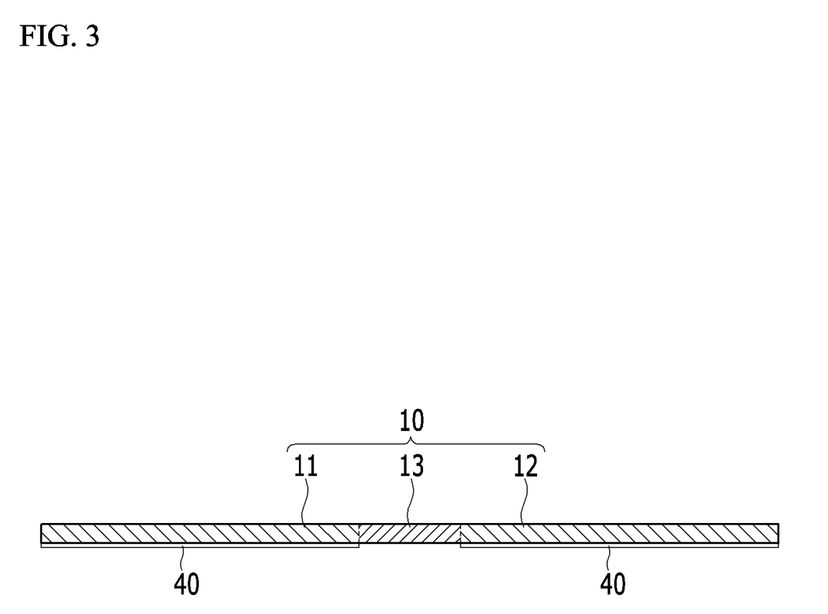
FIG. 3 is a side view schematically showing a flexible display panel of the foldable display when unfolded according to an exemplary embodiment.
Figure 4:
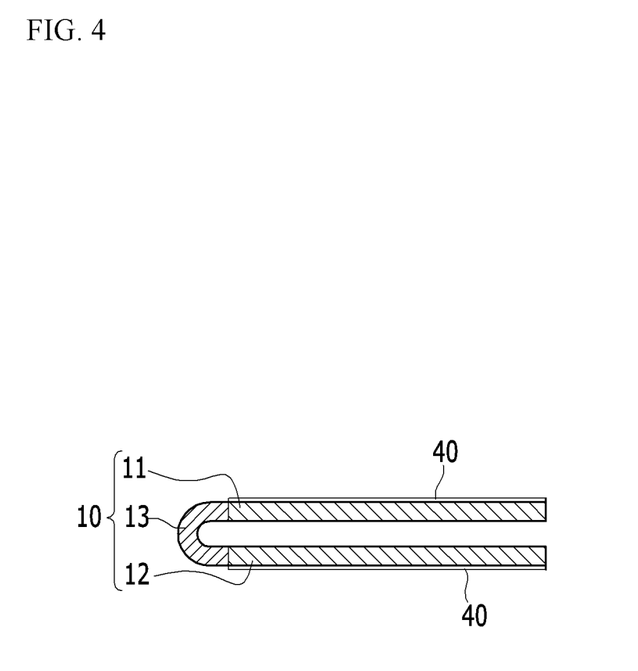
FIG. 4 is a side view schematically showing the flexible display panel of the foldable display when folded according to an exemplary embodiment.

FIG. 1 is a perspective view schematically showing a flexible display panel of a foldable display according to an exemplary embodiment. FIG. 2 is a partial cross-sectional view of the foldable display according to an exemplary embodiment. FIG. 3 is a side view schematically showing a flexible display panel of the foldable display when unfolded according to an exemplary embodiment. FIG. 4 is a side view schematically showing the flexible display panel of the foldable display when folded according to an exemplary embodiment.

As shown in FIGS. 1 to 4, a foldable display 100 according to an exemplary embodiment includes a flexible display panel 10 and a heat dissipation sheet 40 provided below the flexible display panel 10.

The flexible display panel 10 can include a flexible substrate such as a plastic film and can include a seal thin film layer that seals a driving circuit unit or circuit driver and an organic light-emitting diode (OLED) display which are formed on the flexible substrate.

The flexible substrate can be formed of a flexible plastic material, but is not limited thereto. For example, the flexible substrate can also be formed by a metal substrate such as stainless steel, or the like and various flexible materials can be used.

The flexible substrate can be formed of a plastic material having excellent thermal resistance and durability such as polyethylene ether phthalate, polyethylene naphtalate, polycarbonate, polyarylate, polyetherimide, polyether sulfone, polyimide, and the like.

The material of the flexible substrate is not limited thereto, but the flexible substrate can also be formed of a metal substrate such as stainless steel, or the like and various flexible materials can be used.

The driving circuit unit includes a thin film transistor and drives the OLED display. The OLED display is connected to the driving circuit unit so as to emit light and display an image in response to a driving signal received from the driving circuit unit.

The OLED display and the driving circuit unit can be formed to have various structures within the scope in of those skilled in the art.

The sealing thin film layer is formed on the flexible substrate so as to cover the OLED display and the driving circuit unit. The sealing thin film layer can be formed of a plurality of inorganic layers or by mixing the inorganic layers.

A cover window 20 is formed on an upper side of the flexible display panel 10 to protect the flexible display panel 10 from external impact. The cover window 20 is arranged over the side of the flexible display panel 10 that displays images and can be formed of a transparent rigid material so as to protect the flexible display panel 10 from external impact while transmitting the image of the flexible display panel 10 therethrough.

The cover window 20 can be formed to have a single layer structure or a multilayer structure including at least one of acrylic, polycarbonate (PC), and polyethylene terephthalate (PET).

The flexible display panel 10 and the cover window 20 can be fixed to a supporting body 50. The supporting body 50 can include a first supporting part or first support 51, a second supporting part or second support 52, and a hinge part or hinge 53 connecting the first supporting part 51 to the second supporting part 52. The supporting body 50 can be unfolded and/or folded around the hinge part 53 and the flexible substrate and the cover window 20 are also unfolded or folded around the hinge part 53 according to the operation of the supporting body 50.

Meanwhile, a touch screen panel (TSP) 30 that can sense touch input received from a user can be further provided between the flexible display panel 10 and the cover window 20.

A panel in which a touch sensor is formed is referred to as a touch panel 30 (or also referred to as a touch sensor panel, a touch screen panel, or the like). The flexible display panel 10 that includes a touch sensor is also referred to as a touch panel 30.

Meanwhile, the heat dissipation sheet 40 is provided below the flexible display panel 10. Hereinafter, a detailed configuration of the heat dissipation sheet 40 will be described.

Figure 5:
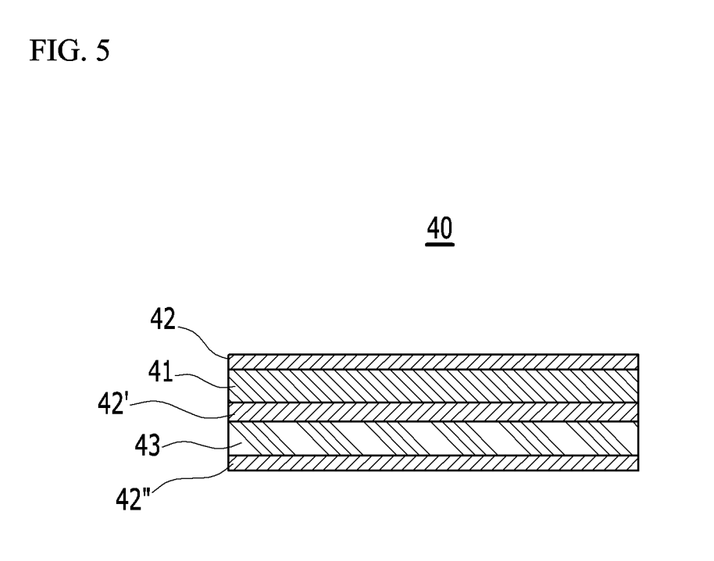
FIG. 5 is a side view showing a configuration of a heat dissipation sheet according to an exemplary embodiment.

FIG. 5 is a side view showing a configuration of the heat dissipation sheet according to an exemplary embodiment.

As shown in FIG. 5, the heat dissipation sheet 40 can be formed by stacking a graphite sheet 41 including graphite and a copper sheet 43 including copper. Bonding layers 42, 42', and 42" are provided between the graphite sheet 41 and the copper sheet 43. In some embodiments, the bonding layers 42, 42', and 42" are adhesives or double-sided tape.

The copper sheet 43 and the graphite sheet 41 are bonded to each other by the bonding layer 42' and the heat dissipation sheet 40 is bonded to a lower portion of the flexible display panel 10 by another bonding layer 42. The heat dissipation sheet 40 is bonded to a housing (not shown) by yet another bonding layer 42".

Although an embodiment in which the heat dissipation sheet 40 including the graphite sheet 41 and the copper sheet 43 stacked together is illustrated in FIG. 5 by way of example, the described technology is not necessarily limited thereto. For example, the heat dissipation sheet 40 can also be formed of a single layer including the graphite sheet 41 or the copper sheet 43.

The thermal conductivity of the heat dissipation sheet 40 in the X and Y directions (a horizontal direction based on the drawing) is about 200 to about 400 W/mK and thermal conductivity in a Z direction (a vertical direction based on the drawing) is about 1 to about 5 W/mK. That is, the thermal conductivity in the vertical direction of the heat dissipation sheet 40 is much greater than that in the horizontal directions thereof.

Therefore, by providing the heat dissipation sheet 40, heat generated from a variety of components included in the flexible display panel 10 can be uniformly transferred in the horizontal direction. Particularly, heat generated from driving components (e.g., a drive, an integrated circuit (IC), and the like) among the components included in the flexible display panel 10 needs to be effectively dissipated to the environment. In at least one embodiment, by uniformly dissipating heat generated from the driving components to the entire area of the flexible display panel 10 through the heat dissipation sheet 40, it is possible to prevent the temperature around the driving components from being sharply increased and consequently, it is possible to prevent the driving components from being degraded due to such high temperatures.

As such, by attaching the heat dissipation sheet 40 to the lower portion of the flexible display panel 10, heat generated from the flexible display panel 10 is dissipated to the environment, thereby making it possible to maintain the temperature of the flexible display panel 10 below a predetermined temperature.

Referring to again FIGS. 1 to 4, the flexible display panel 10 is divided into a folding region 13 and plane regions 11 and 12.

The folding region 13 is a region which is formed along a direction at a central portion of the flexible display panel 10 and is applied with tensile and compressive forces generated when the flexible display panel 10 is bent so as to be deformed.

The plane regions 11 and 12 may be symmetrically formed on both sides of the folding region 13 and is a region which maintains an original shape and is not deformed when the flexible display panel 10 is bent. As such, the plane regions are rigid.

As shown in FIG. 4, when the flexible display panel 10 is bent, an outer side of the folding region 13 experiences tensile force, so as to tension to be stretched, and an inner side thereof experiences compressive force, so as to be compressed. As a result, the appearance of the folding region 13 is deformed.

The folding region 13 can be positioned so as to correspond to the hinge part 53 of the supporting body 50 and the plane regions 11 and 12 can be positioned so as to correspond to the first supporting part 51 and the second supporting part 52.

Figure 6:
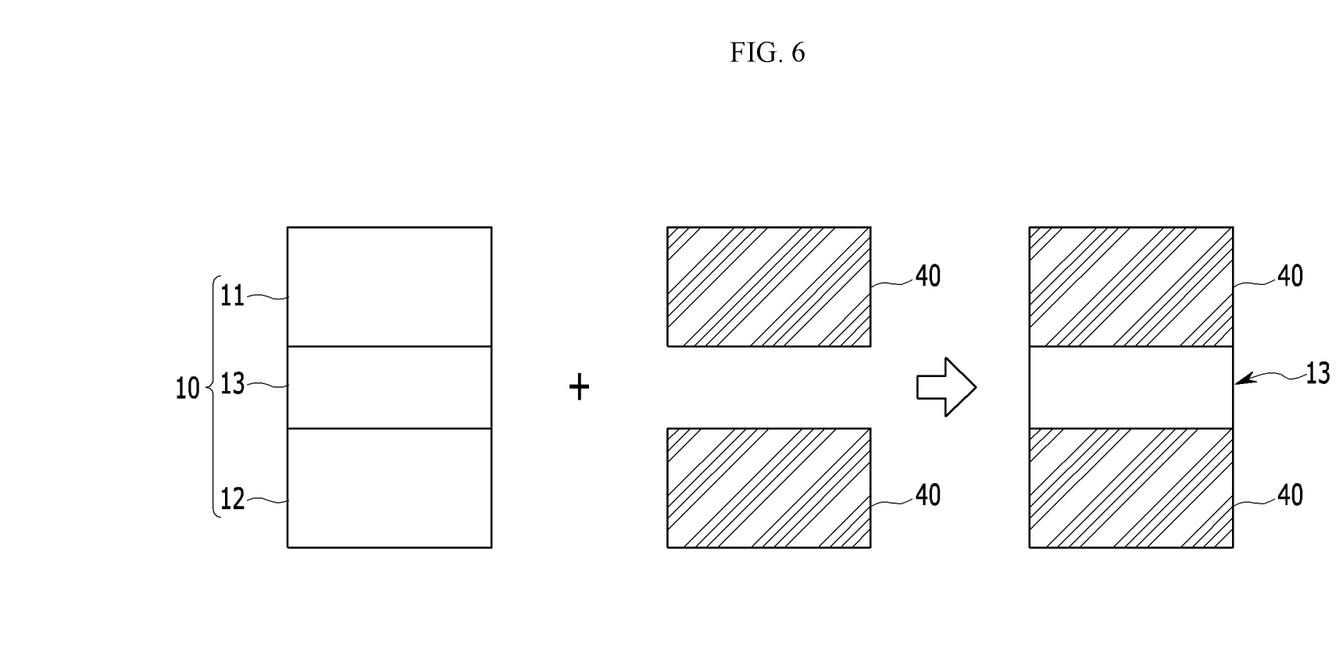
FIG. 6 is a rear view showing a method of attaching the heat dissipation sheet to the flexible display panel of the foldable display according to an exemplary embodiment.

FIG. 6 is a rear view showing a method of attaching the heat dissipation sheet 40 to the flexible display panel 10 of the foldable display according to an exemplary embodiment.

As shown in FIG. 6, the heat dissipation sheet 40 is attached to only the lower portions of the plane regions 11 and 12 of the flexible display panel 10. The bonding layer is provided between the lower portions of the plane regions 11 and 12 of the flexible display panel and the heat dissipation sheet 40. The bonding layer can include an adhesive or a double-sided tape. That is, the lower portions of the plane regions 11 and 12 of the flexible display panel and the heat dissipation sheet 40 are bonded via the adhesive or the double-sided tape.

As such, by providing the heat dissipation sheet 40 to only the lower portions of the plane regions 11 and 12 of the flexible display panel 10, it is possible to design the flexible display panel 10 so as to minimize the thickness of the folding region 13 of the flexible display panel 10.

Since the flexible display panel 10 is generally manufactured to have a thin profile, an increase in the number of layers of the flexible display panel 10 has a large effect on the thickness of the flexible display panel 10, the restoration force when the flexible display panel 10 is folded, and stress applied to the flexible display panel 10 when folded.

Particularly, when the thickness of the flexible display panel 10 increases, the flexibility of the folding region 13 of the flexible display panel 10 decreases. In addition, since the restoration force and stress increase when the flexible display panel 10 is folded, the difficulty in designing mechanical devices included in the folded display 100, for example, the first supporting part 51, the second supporting part, and the hinge part 53, may increase.

Therefore, according to at least one embodiment, by attaching the heat dissipation sheet 40 to only the plane regions 11 and 12 of the flexible display panel 10, it is possible to prevent the thickness of the folding region 13 of the flexible display panel 10 from increasing and consequently, it is possible to improve the flexibility of the flexible display panel 10.

Further, according to at least one embodiment, when the flexibility of the flexible display panel 10 increases, it is possible to prevent the restoration force and stress generated from the folding region of the flexible display panel 10 from increasing when the flexible display panel 10 is folded. Accordingly, the apparatuses integral with the flexible display panel (e.g., the supporting body, or the like) included in the foldable display can be more easily designed.

Further, when the flexible display panel 10 is repeatedly folded or unfolded, a boundary portion of the folding region 13 and the plane regions 11 and 12 of the heat dissipation sheet 40 may be damaged.

Therefore, according to at least one embodiment, the heat dissipation sheet 40 is attached to only the plane regions 11 and 12 of the flexible display panel 10, and thus, it is possible to prevent the folded portion of the heat dissipation sheet 40 from being damaged even though the flexible display panel 10 is repeated folded and unfolded.

Hereinabove, exemplary embodiments have been described, but the described technology is not limited the above-mentioned exemplary embodiments and modified examples. For example, an OLED display has been described by way of example, but the described technology can be applied to display panels of other display devices such as liquid crystal displays and the like.

The scope of the inventive technology is determined by the following claims and those skilled in the art will easily appreciate that the invention is not limited thereto and various modifications and alteration may be made without departing from the scope and spirit of the inventive technology as disclosed in the accompanying claims.

What is claimed is:

1. A flexible display, comprising:
   a flexible display panel including: i) a folding region at which the flexible display panel is configured to be folded and ii) a pair of non-folding regions formed on opposing sides of the folding region; and
   a heat dissipation sheet attached to one side of at least one of the non-folding regions and configured to dissipate heat generated by the flexible display panel, wherein the heat dissipation sheet does not overlap with at least one portion of the folding region.

2. The flexible display of claim 1, further comprising a bonding layer interposed between the flexible display panel and the heat dissipation sheet.

3. The flexible display of claim 2, wherein the bonding layer includes an adhesive or a double-sided tape.

4. The flexible display of claim 1, wherein the heat dissipation sheet comprises a copper sheet.

5. The flexible display of claim 1, wherein the heat dissipation sheet comprises a graphite sheet.

6. The flexible display of claim 1, wherein the heat dissipation sheet comprises a copper sheet and a graphite sheet formed over the copper sheet.

7. A flexible display, comprising:
   a flexible display panel including: i) a folding region at which the flexible display panel is configured to be folded and ii) a non-folding region, wherein the non-folding region is more rigid than the folding region; and a heat dissipation sheet attached to one side of the non-folding region and configured to dissipate heat generated by the flexible display panel, wherein the heat dissipation sheet does not overlap with at least one portion of the folding region, wherein the heat dissipation sheet comprises a copper sheet and a graphite sheet formed over the copper sheet, and wherein the heat dissipation sheet further comprises a bonding layer interposed between the copper sheet and the graphite sheet.

8. The flexible display of claim 7, wherein the bonding layer includes an adhesive or a double-sided tape.

9. A flexible display, comprising:

a flexible display panel, wherein the flexible display panel comprises a folding region and a pair of non-folding regions formed on opposing sides of the folding region, wherein the non-folding regions are more rigid than the folding region; and a pair of heat dissipation sheets respectively attached to the non-folding regions, wherein the heat dissipation sheets do not contact at least one portion of the folding region.

10. The flexible display of claim 9, further comprising a cover window attached to the flexible display panel, wherein the heat dissipation sheets and the cover window are attached to opposing sides of the flexible display panel.

11. The flexible display of claim 9, wherein each of the heat dissipation sheets comprises a copper sheet and a graphite sheet formed over the copper sheet.

* * * * *